(12) United States Patent
Lee

(10) Patent No.: US 6,214,741 B1
(45) Date of Patent: Apr. 10, 2001

(54) METHOD OF FABRICATING A BIT LINE OF FLASH MEMORY

(75) Inventor: Tong-Hsin Lee, Taipei Hsien (TW)

(73) Assignees: United Silicon Incorporated; United Microelectronics Corp., both of Hsinchu (TW)

( * ) Notice: Subject to any disclaimer, the term of this patent is extended or adjusted under 35 U.S.C. 154(b) by 0 days.

(21) Appl. No.: 09/434,712

(22) Filed: Nov. 5, 1999

(51) Int. Cl.[7] ................................................. H01L 21/00
(52) U.S. Cl. ........................... 438/719; 438/723; 438/724
(58) Field of Search ................................. 438/692, 719, 438/723, 724, 738, 743, 744; 216/2, 38, 67, 79

(56) References Cited

U.S. PATENT DOCUMENTS 5,925,575 * 7/1999 Tao et al. ........................... 438/719 X
6,069,091 * 5/2000 Chang et al. ........................ 438/719

* cited by examiner

Primary Examiner—William Powell
(74) Attorney, Agent, or Firm—Charles C. H. Wu; Charles C. H. Wu & Associates, APC

(57) ABSTRACT

A method of fabricating a bit line of a flash memory. A silicon-on-insulator (SOI) has a buried oxide layer therein and a silicon layer thereon. A patterned hard mask layer is formed on the silicon layer. The exposed silicon layer and the buried oxide layer thereunder are removed to form a bit line opening while using the hard mask layer as a mask. A conformal lightly doped polysilicon layer is formed over the substrate. A heavily doped polysilicon layer is formed over the substrate and filling the bit line opening. The lightly doped polysilicon layer and the heavily doped polysilicon layer are removed until arriving at the silicon layer to form a bit line. The hard mask layer is then removed.

20 Claims, 3 Drawing Sheets

METHOD OF FABRICATING A BIT LINE OF FLASH MEMORY

BACKGROUND OF THE INVENTION

1. Field of the Invention

The invention relates to a method for fabricating a flash memory, and more particularly, to a method for fabricating a split-gate flash memory.

2. Description of the Related Art

At present, nonvolatile memory is widely used in the whole range of electrical devices. In particular, programmable nonvolatile memory having a flash memory structure such as the erasable programmable read-only memory (EPROM) and the electrically erased programmable read-only memory (EEPROM) has attracted immense interest. In general, a flash memory comprises two gates, a floating gate for charge storage and a control gate for data accessing. The floating gate is in a floating state without being connected to any electrical circuit and is located between the control gate and a substrate while the control gate is connected to a word line.

FIGS. 1A–1C are schematic, cross-sectional views illustrating fabrication of a split-gate flash memory.

Referring to FIG. 1A, a patterned oxide layer 102 is formed on a silicon substrate 100 to serve as a mask layer. The oxide layer 102 has an opening 104 for fabricating a bit line.

Referring to FIG. 1B, an ion implanting process is performed. Ions are implanted into the exposed portions of the silicon substrate 100 to form bit lines 106 and 108, wherein the bit line 106 serves as a source and the bit line 108 serves as a drain.

Referring to FIG. 1C, after the oxide layer 102 is removed, a tunneling oxide layer 110 is formed over the whole substrate 100. A polysilicon floating gate 112 is formed above a portion of the drain 108 and above the portion of the substrate 100 beside the drain 108. A split-gate oxide 114 is then formed over the substrate 100. A control gate 116 connected to a word line is formed above portions of the floating gate 112 and the drain 106 and above the portion of the substrate therebetween.

As the integration of integrated circuit (IC) is increased, the width of bit line in the flash memory is narrowed. It is well known in the art that the cross-sectional area of the bit line is decreased with the line width and results in an increase of the resistance, thereby reducing the speed of device operation. Although the resistance of a bit line in the prior art can be reduced by increasing the doped ion concentration of the bit line, the junction breakdown voltage and the carrier punchthrough capability in the flash memory are relatively degraded and therefore affect the operation characteristic of the device. In addition, after a thermocycle in the back-end process, the ions implanted into the bit line will diffuse out into adjacent regions and cause a subthreshold leakage.

The doped ion concentration of the bit line should be increased because of the shrinkage of the line width, but it should be decreased since the degradation of the junction breakdown voltage and carrier punchthrough capability. Hence, the process window is greatly shrunk, which increases the process difficulty and reduces the quality of the product.

SUMMARY OF THE INVENTION

The present invention therefore provides an improved method of fabricating a bit line of a flash memory within two different doped ion concentrations in a SOI substrate, and thereby forming a narrow bit line without increasing the resistance of the bit line and without the problems of the junction breakdown voltage, carrier punchthrough capability, diffusion, etc.

The invention provides a method of fabricating a bit line of a flash memory. The method of the invention comprises the following steps. A silicon-on-insulator (SOI) substrate is provided. The substrate comprises a buried oxide layer and a silicon layer thereon. A patterned hard mask layer is formed on the silicon layer. The exposed silicon layer and buried oxide layer thereunder are removed to form a bit line opening while using the hard mask layer as a mask. A conformal lightly doped polysilicon layer is formed over the substrate. A heavily doped polysilicon layer is formed over the substrate and filling the bit line opening. The lightly doped and heavily doped polysilicon layers are removed until arriving at the silicon layer to form a bit line. The hard mask layer is then removed.

According to the method of the invention, a polysilicon bit line with two different doped ion concentrations is formed. The internal portion of the bit line with a heavily doped ion concentration can reduce the resistance, and the external portion of the bit line with a lightly doped ion concentration can avoid the problems of junction breakdown voltage, carrier punchthrough capability, diffusion, etc.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
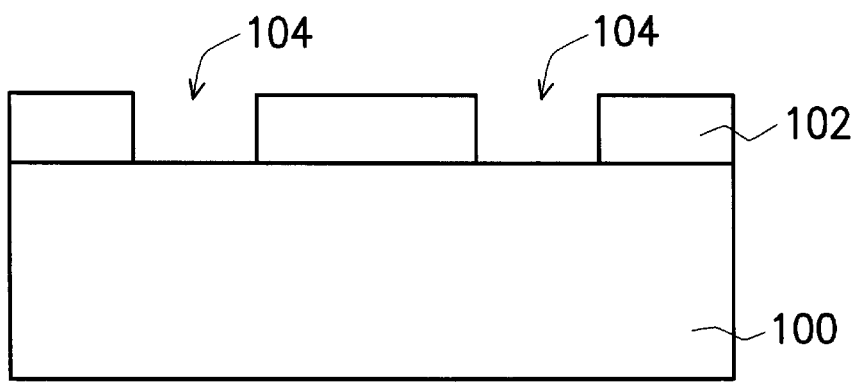
FIGS. 1A–1C are schematic, cross-sectional views illustrating fabrication of a split-gate flash memory.
Figure 1B:
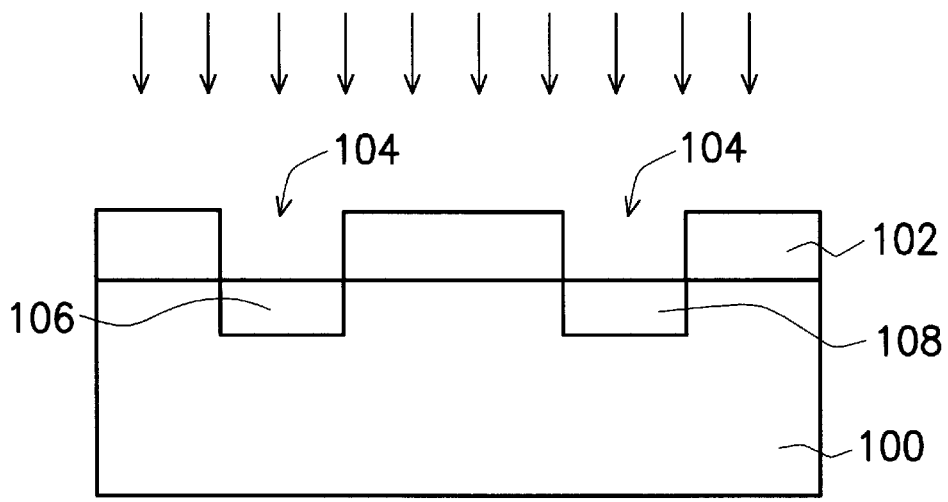
Figure 1C:
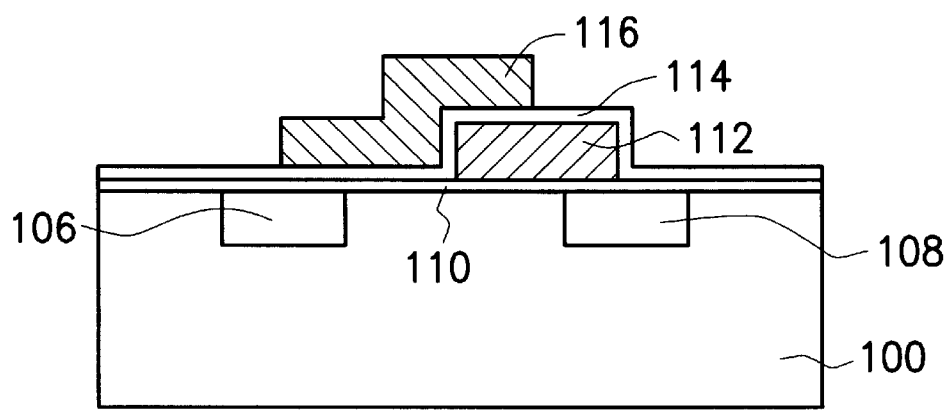

Reference will now be made in detail to the present preferred embodiment of the invention, examples of which are illustrated in the accompanying drawings. Wherever possible, the same reference numbers are used in the drawings and the description to refer to the same or like parts.

Figure 2A:
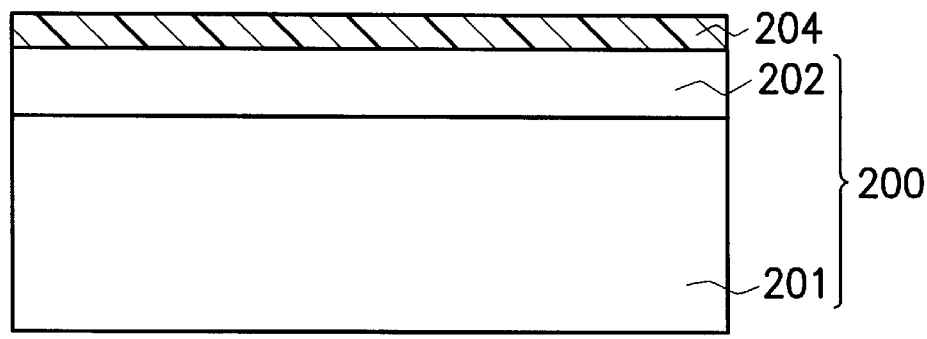
FIGS. 2A–2F are schematic, cross-sectional views illustrating fabrication of a split-gate flash memory according to one preferred embodiment of the present invention.

Referring to FIG. 2A, a silicon-on-insulator (SOI) substrate 200 is provided. Similar to the general SOI substrate, the substrate 200 has a buried oxide layer 201 and a silicon layer 202 on the buried oxide layer 201, wherein the silicon layer has a thickness of about 500–1000 angstroms. By using the SOI substrate 200, a parasitic capacitor caused by a subsequently formed deep bit line can be reduced. A hard mask layer 204, such as a silicon nitride layer, is formed as a hard mask in the subsequent process.

Figure 2B:
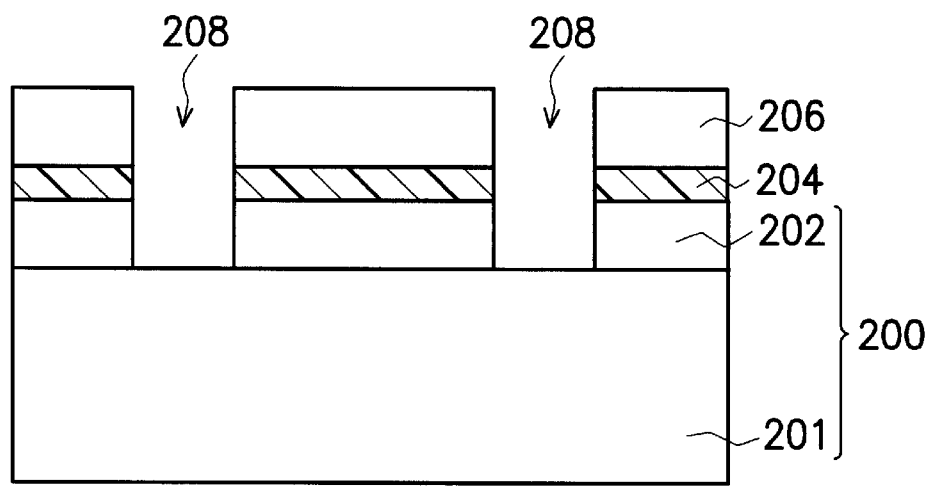

Referring to FIG. 2B, a patterned photoresist layer 206 is formed on the hard mask layer 204 to define the layout of the bit line. The exposed hard mask layer 204 and silicon layer 202 are removed by, for example, anisotropic dry etching until exposing the buried oxide layer 201 to form an opening 208 for fabricating a bit line while using the photoresist layer 206 as a mask.

Figure 2C:
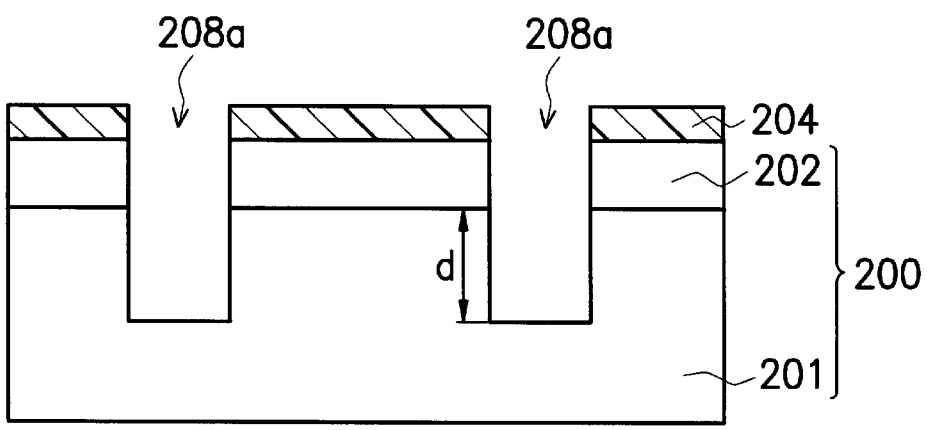

Referring to FIG. 2C, the photoresist layer is then removed. A thickness (d) of the exposed buried oxide layer in the bottom of the opening 208 is removed by, for example, anisotropic dry etching to form a bit line opening 208a, wherein the thickness (d) is about 1000–3000 angstroms, and is preferably about 2000 angstroms.

By narrowing the width and deepening the depth of the bit line opening 208a, on one hand, the size of the flash memory can be reduced, and on the other hand, the cross-sectional area of the bit line can be maintained.

Figure 2D:
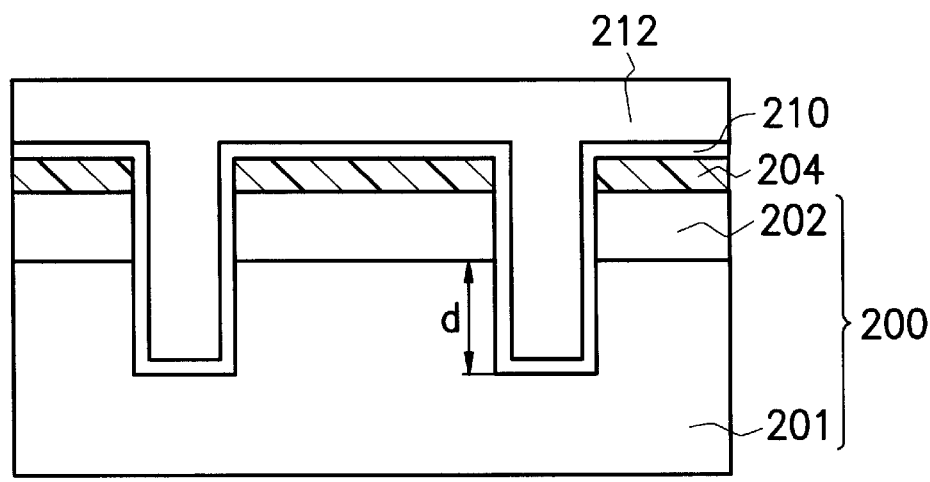

Referring to FIG. 2D, a conformal lightly doped polysilicon layer 210 having a thickness of about 200–300 angstroms is formed over the whole substrate 200. The lightly doped polysilicon layer 210 is formed by, for example, implanting an undoped polysilicon layer over the substrate 200 with an energy of about 20–50 KeV and the dosage of about 1E13–3E13 l/cm$^2$, or by depositing an in-situ doped polysilicon layer while using the low pressure chemical vapor deposition (LPCVD). A heavily doped polysilicon layer 212 is formed over the whole substrate 200, and filling the bit ling opening 208a. The heavily doped polysilicon layer 212, such as an in-situ doped polysilicon layer formed by LPCVD, has a thickness of about 2000–3000 angstroms.

Figure 2E:
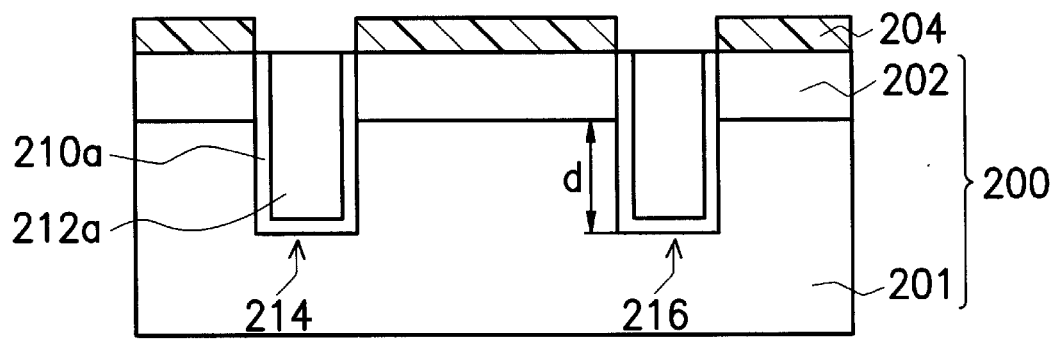

Referring to FIG. 2E, the heavily doped polysilicon layer 212 and the lightly doped polysilicon layer 210 on the hard mask layer 204 are removed until arriving at the silicon layer 202 (i.e. arriving at the interface between the silicon layer 202 and the hard mask layer 204) to form bit lines 214 and 216 in the substrate 200, and thus the heavily doped polysilicon layer 212a and lightly doped polysilicon layer 210a are formed. The heavily doped polysilicon layer 212 and the lightly doped polysilicon layer 210 are removed by the following exemplary steps. The heavily doped polysilicon layer 212 and the lightly doped polysilicon layer 210 are polished by chemical mechanical polishing (CMP) until exposing the hard mask layer 204. The heavily doped polysilicon layer 212 and the lightly doped polysilicon layer 210 are etched back by time mode control until arriving at the silicon layer 202. The hard mask layer 204, such as a silicon nitride layer, is then removed by a phosphoric acid ($H_3PO_4$) solution.

The bit lines 214 and 216 according to the present invention have the heavily doped polysilicon layer 212a in the internal portion and have the lightly doped polysilicon layer 210a in the external portion. The heavily doped polysilicon layer 212a in the internal portion can reduce the resistance of the bit line, and the lightly doped polysilicon layer 210a in the external portion can prevent the degradation of a junction breakdown voltage and carrier punchthrough capability, and the subthreshold leakage caused by diffusion. Therefore, the problem of increasing the process difficulty due to the small process window can be solved, and the quality of the product can be maintained.

Figure 2F:
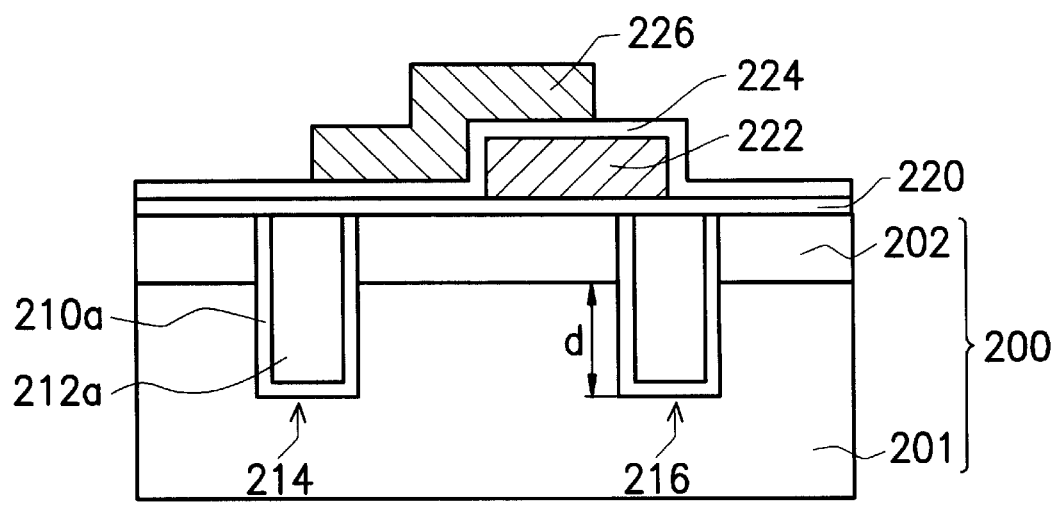

Referring to FIG. 2F, the bit line 214 is intended to be a source and the bit line 216 is intended to be a drain in a single flash memory. A tunneling oxide 220 is then formed over the substrate 200. A floating gate 222, such as a polysilicon gate, is formed above the drain 216 and above the portion of the substrate 200 beside the drain 216. A split-gate oxide 224 is then formed over the substrate 200. A control gate 226 connected to a word line is formed above portions of the floating gate 112 and the source 214, and above the portion of the substrate 200 between the floating gate 112 and the source 214.

According to the preferred embodiment of the invention, (1) a narrow width bit line is employed when fabricating a small size flash memory, (2) by increasing the bit line depth and forming the heavily doped polysilicon layer in the internal portion of the bit line, the bit line resistance can be reduced, and (3) by forming the lightly doped polysilicon layer in the external portion of the bit line, the degradation of the junction breakdown voltage and carrier punchthrough capability and the problem of out-diffusion can be avoided.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a bit line of a flash memory comprising:

providing a substrate which has a buried oxide therein and a silicon layer thereon;

forming a patterned hard mask layer on the silicon layer;

removing the exposed silicon layer and the buried oxide thereunder to form a bit line opening while using the hard mask layer as a mask;

forming a conformal lightly doped polysilicon layer over the substrate;

forming a heavily doped polysilicon layer over the substrate and filling the bit line opening;

removing the lightly doped polysilicon layer and heavily doped polysilicon layer until arriving at the silicon layer; and removing the hard mask layer.

2. The method according to claim 1, wherein a thickness of the silicon layer is about 500–1000 angstroms.

3. The method according to claim 1, wherein the hard mask layer comprises a silicon nitride layer.

4. The method according to claim 1, wherein the silicon layer and the buried oxide layer thereunder are removed by anisotropic dry etching.

5. The method according to claim 1, wherein the thickness of the buried oxide removed to form the bit line opening is about 2000 angstroms.

6. The method according to claim 1, wherein a thickness of the lightly doped polysilicon layer is about 200–300 angstroms.

7. A method of fabricating a flash memory comprising:

providing a substrate which has a buried oxide therein and a silicon layer thereon;

forming a patterned hard mask layer on the silicon layer;

removing the silicon layer and the buried oxide thereunder to form a source opening and a drain opening;

forming a conformal lightly doped polysilicon layer over the substrate;

forming a heavily doped polysilicon layer over the substrate and filling the source opening and the drain opening;

removing the lightly doped polysilicon layer and the heavily doped polysilicon layer until arriving at the silicon layer to form a source and a drain;

removing the hard mask layer;

forming a tunneling oxide over the substrate;

forming a floating gate above the drain and above a portion of the substrate beside the drain;

forming a split-gate oxide over the substrate; and forming a control gate above portions of the source and the floating gate and above the portion of the substrate therebetween.

8. The method of claim 7, wherein a thickness of the silicon layer is about 500–1000 angstroms.

9. The method of claim 7, wherein the hard mask layer comprises a silicon nitride layer.

10. The method of claim 7, wherein the silicon layer and the buried oxide layer thereunder are removed by anisotropic dry etching.

11. The method of claim 7, wherein a thickness of the buried oxide removed to form the bit line opening is about 2000 angstroms.

12. The method of claim 7, wherein a thickness of the lightly doped polysilicon layer is about 200–300 angstroms.

13. The method of claim 7, wherein a material for the floating gate comprises polysilicon.

14. A method of fabricating a bit line of a flash memory comprising:

providing a substrate which has a buried oxide therein and a silicon layer thereon;

forming a hard mask layer on the silicon layer;

forming a patterned photoresist layer on the hard mask layer;

removing the exposed hard mask layer and the silicon layer in sequence until exposing the buried oxide layer while using the photoresist layer as a mask;

removing the photoresist layer;

removing the exposed buried oxide layer to form a bit line opening while using the hard mask layer as a mask;

forming a conformal lightly doped polysilicon layer over the substrate;

forming a heavily doped polysilicon layer over the substrate and filling the bit line opening;

removing the lightly doped polysilicon layer and the heavily doped polysilicon layer until arriving at the silicon layer; and removing the hard mask layer.

15. The method of claim 14, wherein a thickness of the silicon layer is about 500–1000 angstroms.

16. The method of claim 14, wherein the hard mask layer comprises a silicon nitride layer.

17. The method of claim 14, wherein the hard mask layer and the silicon layer are removed by anisotropic dry etching.

18. The method of claim 14, wherein the buried oxide layer is removed by anisotropic dry etching.

19. The method of claim 14, wherein a depth of the bit line opening is about 2000 angstroms.

20. The method of claim 14, wherein a thickness of the buried oxide removed to form the bit line opening is about 2000 angstroms.

* * * * *